US011475970B1

(12) United States Patent
Lee et al.

(10) Patent No.: US 11,475,970 B1
(45) Date of Patent: Oct. 18, 2022

(54) BIPOLAR READ RETRY

(71) Applicant: Micron Technology, Inc., Boise, ID (US)

(72) Inventors: Yen Chun Lee, Boise, ID (US); Karthik Sarpatwari, Boise, ID (US); Nevil N. Gajera, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/337,808

(22) Filed: Jun. 3, 2021

(51) Int. Cl.
*G11C 29/42* (2006.01)
*G11C 29/44* (2006.01)
*G11C 16/34* (2006.01)
*G11C 29/12* (2006.01)

(52) U.S. Cl.
CPC .......... *G11C 29/42* (2013.01); *G11C 16/3404* (2013.01); *G11C 29/12005* (2013.01); *G11C 29/44* (2013.01); *G11C 2029/1202* (2013.01); *G11C 2029/1204* (2013.01)

(58) Field of Classification Search
CPC ................ G11C 29/42; G11C 16/3404; G11C 2029/1202; G11C 2029/1204
See application file for complete search history.

(56) References Cited

U.S. PATENT DOCUMENTS

| 9,799,381 | B1 | 10/2017 | Tortorelli et al. | |
| 2016/0111150 | A1* | 4/2016 | Bazarsky | G06F 11/1012 714/764 |
| 2018/0158493 | A1* | 6/2018 | Ryu | G06F 11/08 |
| 2019/0042356 | A1* | 2/2019 | Chen | G11C 16/26 |
| 2020/0202928 | A1* | 6/2020 | Pio | G11C 13/0004 |
| 2021/0217470 | A1 | 7/2021 | Di Vincenzo et al. | |

FOREIGN PATENT DOCUMENTS

WO          2022101655          5/2022

* cited by examiner

*Primary Examiner* — Han Yang
(74) *Attorney, Agent, or Firm* — Greenberg Traurig

(57) ABSTRACT

Systems, methods and apparatus to implement bipolar read retry. In response to a determination that a first result of reading a set of memory cells using a first magnitude of read voltage is erroneous, a second magnitude of read voltage, greater than the first magnitude, is identified for the bipolar read retry. In the retry, a controller uses voltage drivers to apply, to the set of memory cells, first voltages of the second magnitude in a first polarity to obtain a second result of reading the set of memory cells and, after the second result is generated and in parallel with decoding the second result, apply second voltages of the second magnitude in a second polarity, opposite to the first polarity.

15 Claims, 7 Drawing Sheets

BIPOLAR READ RETRY

TECHNICAL FIELD

At least some embodiments disclosed herein relate to memory systems in general and, more particularly but not limited to, techniques of reading memory cells to retrieve data.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

A memory device can include a memory integrated circuit having one or more arrays of memory cells formed on an integrated circuit die of semiconducting material. A memory cell is a smallest unit of memory that can be individually used or operated upon to store data. In general, a memory cell can store one or more bits of data.

Different types of memory cells have been developed for memory integrated circuits, such as random access memory (RAM), read-only memory (ROM), dynamic random access memory (DRAM), static random access memory (SRAM), synchronous dynamic random access memory (SDRAM), phase change memory (PCM), magneto random access memory (MRAM), negative-or (NOR) flash memory, electrically erasable programmable read-only memory (EE-PROM), flash memory, etc.

Some integrated circuit memory cells are volatile and require power to maintain data stored in the cells. Examples of volatile memory include Dynamic Random-Access Memory (DRAM) and Static Random-Access Memory (SRAM).

Some integrated circuit memory cells are non-volatile and can retain stored data even when not powered. Examples of non-volatile memory include flash memory, Read-Only Memory (ROM), Programmable Read-Only Memory (PROM), Erasable Programmable Read-Only Memory (EPROM) and Electronically Erasable Programmable Read-Only Memory (EEPROM) memory, etc. Flash memory includes negative-and (NAND) type flash memory or a negative-or (NOR) type flash memory. A NAND memory cell is based on a NAND logic gate; and a NOR memory cell is based on a NOR logic gate.

Cross-point memory (e.g., 3D XPoint memory) uses an array of non-volatile memory cells. The memory cells in cross-point memory are transistor-less. Each of such memory cells can have a selector device and optionally a phase-change memory device that are stacked together as a column in an integrated circuit. Memory cells of such columns are connected in the integrated circuit via two layers of wires running in directions that are perpendicular to each other. One of the two layers is above the memory cells; and the other layer is below the memory cells. Thus, each memory cell can be individually selected at a cross point of two wires running in different directions in two layers. Cross point memory devices are fast and non-volatile and can be used as a unified memory pool for processing and storage.

A non-volatile integrated circuit memory cell can be programmed to store data by applying a voltage or a pattern of voltage to the memory cell during a program/write operation. The program/write operation sets the memory cell in a state that corresponds to the data being programmed/stored into the memory cell. The data stored in the memory cell can be retrieved in a read operation by examining the state of the memory cell. The read operation determines the state of the memory cell by applying a voltage and determining whether the memory cell becomes conductive at a voltage corresponding to a pre-defined state.

BRIEF DESCRIPTION OF THE DRAWINGS

The embodiments are illustrated by way of example and not limitation in the figures of the accompanying drawings in which like references indicate similar elements.

DETAILED DESCRIPTION

Figure 1:
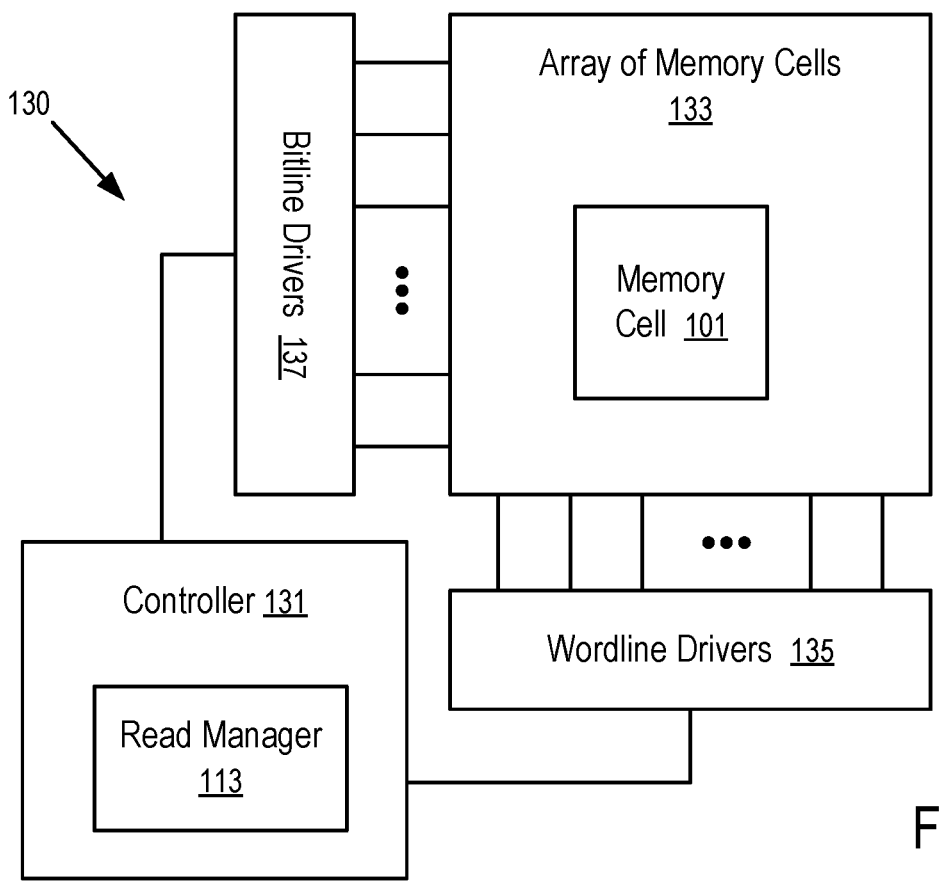
FIG. 1 shows a memory device configured with a read manager according to one embodiment.

At least some aspects of the present disclosure are directed to a memory sub-system configured to use voltage pulses in both polarities during read retry to reduce or minimize impacts on readability of memory cells.

The memory sub-system can be used as a storage device and/or a memory module. Examples of storage devices, memory modules, and memory devices are described below in conjunction with FIG. 11. A host system can utilize a memory sub-system that includes one or more components, such as memory devices that store data. The host system can provide data to be stored at the memory sub-system and can request data to be retrieved from the memory sub-system.

An integrated circuit memory cell, such as a memory cell in a flash memory or a memory cell in a cross-point memory, can be programmed to store data by the way of its state at a voltage applied across the memory cell.

For example, if a memory cell is configured or programmed in such a state that allows a substantial current to pass the memory cell at a voltage in a predefined voltage region, the memory cell is considered to have been configured or programmed to store a first bit value (e.g., one or zero); and otherwise, the memory cell is storing a second bit value (e.g., zero or one).

Optionally, a memory cell can be configured or programmed to store more than one bit of data by being configured or programmed to have a threshold voltage in one of more than two separate voltage regions.

The threshold voltage of a memory cell is such that when the voltage applied across the memory cell is increased to above the threshold voltage, the memory cell changes rapidly or abruptly, snaps, or jumps from a non-conductive state to a conductive state. The non-conductive state allows a small leak current to go through the memory cell; and in contrast, the conductive state allows more than a threshold amount of current to go through. Thus, a memory device can use a sensor to detect the change, or determine the conductive/non-conductive state of the memory device at one or more applied voltages, to evaluate or classify the level of the threshold voltage of the memory cell and thus its stored data.

The threshold voltage of a memory cell being configured/programmed to be in different voltage regions can be used to represent different data values stored in the memory cell. For example, the threshold voltage of the memory cell can be programmed to be in any of four predefined voltage regions; and each of the regions can be used to represent the bit values of a different two-bit data item. Thus, when given a two-bit data item, one of the four voltage regions can be selected based on a mapping between two-bit data items and voltage regions; and the threshold voltage of the memory cell can be adjusted, programmed, or configured to be in the selected voltage region to represent or store the given two-bit data item. To retrieve, determine, or read the data item from the memory cell, one or more read voltages can be applied across the memory cell to determine which of the four voltage regions contain the threshold voltage of the memory cell. The identification of the voltage region that contains the threshold voltage of the memory cell provides the two-bit data item that has been stored, programmed, or written into the memory cell.

For example, a memory cell can be configured or programmed to store a one-bit data item in a Single Level Cell (SLC) mode, or a two-bit data item in a Multi-Level Cell (MLC) mode, or a three-bit data item in a Triple Level Cell (TLC) mode, or a four-bit data item in Quad-Level Cell (QLC) mode, or a five-bit data item in a Penta-Level Cell (PLC) mode.

The threshold voltage of a memory cell can change or drift over a period of time, usage, and/or read operations, and in response to certain environmental factors, such as temperate changes. The rate of change or drift can increase as the memory cell ages. The change or drift can result in errors in determining, retrieving, or reading the data item back from the memory cell.

Random errors in reading memory cells can be detected and corrected using redundant information. Data to be stored into memory cells can be encoded to include redundant information to facilitate error detection and recovery. When data encoded with redundant information is stored in a memory sub-system, the memory sub-system can detect errors in data represented by the voltage regions of the threshold voltages of the memory cells and/or recover the original data that is used to generate the data used to program the threshold voltages of the memory cells. The recovery operation can be successful (or have a high probability of success) when the data represented by the threshold voltages of the memory cells and thus retrieved directly from the memory cells in the memory sub-system contains fewer errors, or the bit error rate in the retrieved data is low and/or when the amount of redundant information is high. For example, error detection and data recovery can be performed using techniques such as Error Correction Code (ECC), Low-Density Parity-Check (LDPC) code, etc.

When the data retrieved from the memory cells of the memory sub-system has too many errors for successful decoding, the memory sub-system may retry the execution of the read command. Voltage pulses applied during read retry can cause threshold voltages previously programmed into separate regions to move closer to each other and into a common region and thus reduce the readability of memory cells.

At least some aspects of the present disclosure address the above and other deficiencies by implementing bipolar read retry. The bipolar read retry applies read voltage pulses to cause memory cells previously programmed into different voltage regions to become conductive in a uniform manner to avoid a portion of memory cells to experience more read disturb than another portion of memory cells. Through the bipolar read retry, memory cells programmed to store different data can experience the same number of times being placed in a conductive state. Further, the bipolar read retry uses minimum or reduced voltages to place memory cells in conductive states and thus reduces read disturb. Thus, the bipolar read try can reduce or minimize impacts on readability of the memory cells.

FIG. 1 shows a memory device 130 configured with a read manager 113 according to one embodiment.

In FIG. 1, the memory device 130 includes an array 133 of memory cells, such as a memory cell 101. An array 133 can be referred to as a tile; and a memory device (e.g., 130) can have one or more tiles. Different tiles can be operated in parallel in a memory device (e.g., 130).

For example, the memory device 130 illustrated in FIG. 1 can have a cross-point memory having at least the array 133 of memory cells (e.g., 101).

In some implementations, the cross point memory uses a memory cell 101 that has an element (e.g., a sole element) acting both as a selector device and a memory device. For example, the memory cell 101 can use a single piece of alloy with variable threshold capability. The read/write operations of such a memory cell 101 can be based on thresholding the memory cell 101 while inhibiting other cells in sub-threshold bias, in a way similar to the read/write operations for a memory cell having a first element acting as a selector device and a second element acting as a phase-change memory device that are stacked together as a column. A selector device usable to store information can be referred to as a selector/memory device.

The memory device 130 of FIG. 1 includes a controller 131 that operates bitline drivers 137 and wordline drivers 135 to access the individual memory cells (e.g., 101) in the array 133.

Figure 2:
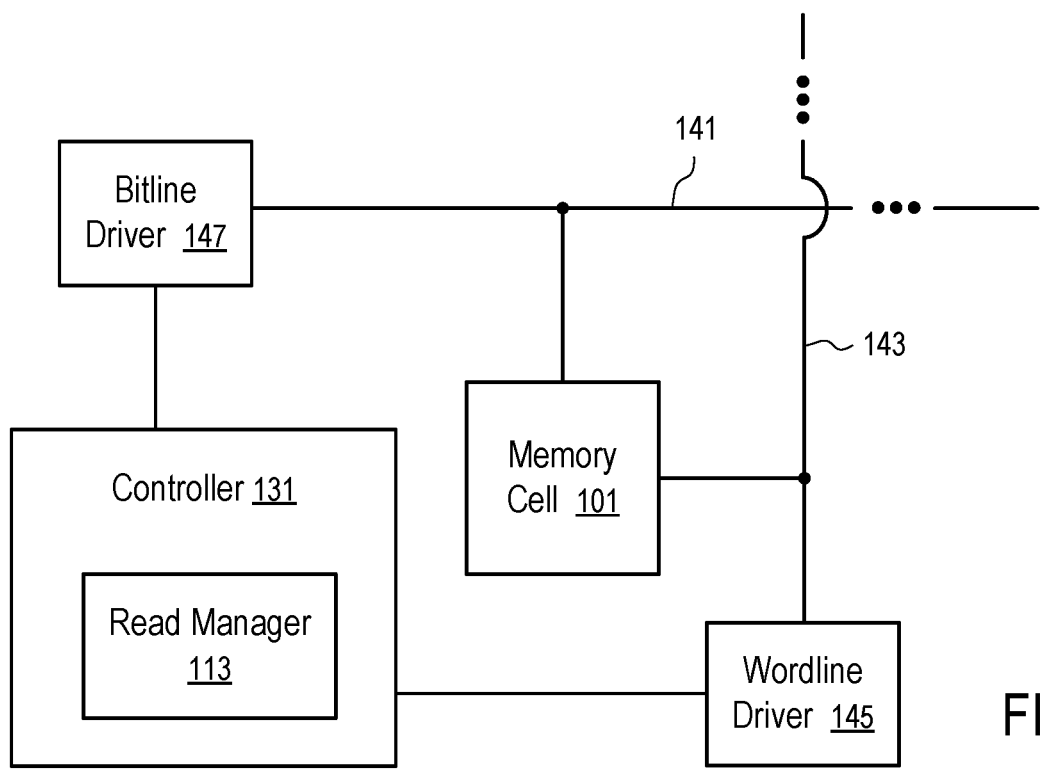
FIG. 2 shows a memory cell with a bitline driver and a wordline driver configured to apply voltage pulses according to one embodiment.

For example, each memory cell (e.g., 101) in the array 133 can be accessed via voltages driven by a pair of a bitline driver 147 and a wordline driver 145, as illustrated in FIG. 2.

The controller 131 includes a read manager 113 configured to implement bipolar read retry. The read manager 113 can be implemented, for example, via logic circuits and/or microcodes/instructions. For example, during a retry, the read manager 113 uses a read voltage having a magnitude larger than a read voltage previously used to read the memory cell (e.g., 101). The read voltage with the increased magnitude applied to the memory cell (e.g., 101) in a first polarity can be sufficient to obtain the error free data from the memory cell (e.g., 101) but introduce uneven stress of read disturb based on the data stored in the memory cell (e.g., 101). To avoid the uneven stress of read disturb, the read voltage with the increased magnitude is also applied to the memory cell (e.g., 101) in a second polarity that is the opposite of the first polarity. The application of the read voltage in the opposite polarity can be performed in parallel with post-processing the data obtained from applying the read voltage in the first polarity. Thus, the additional operation of applying the read voltage in the second polarity does not increase the latency in execution of the read command.

FIG. 2 shows a memory cell 101 with a bitline driver 147 and a wordline driver 145 configured to apply voltage pulses according to one embodiment. For example, the memory cell 101 can be a typical memory cell 101 in the memory cell array 133 of FIG.

The bitline driver 147 and the wordline driver 145 of FIG. 2 are controlled by the read manager 113 of the controller 131 to selectively apply one or more voltages pulses to the memory cell 101.

The bitline driver 147 and the wordline driver 145 can apply voltages of different polarities on the memory cell 101.

For example, in applying one polarity of voltage (e.g., positive polarity), the bitline driver 147 drives a positive voltage relative to the ground on a bitline 141 connected to a row of memory cells in the array 133; and the wordline driver 145 drives a negative voltage relative to the ground on a wordline 143 connected to a column of memory cells in the array 133.

In applying the opposite polarity of voltage (e.g., negative polarity), the bitline driver 147 drives a negative voltage on the bitline 141; and the wordline driver 145 drives a positive voltage on the wordline 143.

The memory cell 101 is in both the row connected to the bitline 141 and the column connected to the wordline 143. Thus, the memory cell 101 is subjected to the voltage difference between the voltage driven by the bitline driver 147 on the bitline 141 and the voltage driven by the wordline driver 145 on the wordline 143.

In general, when the voltage driven by the bitline driver 147 is higher than the voltage driven by the wordline driver 145, the memory cell 101 is subjected to a voltage in one polarity (e.g., positive polarity); and when the voltage driven by the bitline driver 147 is lower than the voltage driven by the wordline driver 145, the memory cell 101 is subjected to a voltage in the opposite polarity (e.g., negative polarity).

In some implementations, the memory cell 101 is a self-selecting memory cell implemented using a selector/memory device. The selector/memory device has a chalcogenide (e.g., chalcogenide material and/or chalcogenide alloy). For example, the chalcogenide material can include a chalcogenide glass such as, for example, an alloy of selenium (Se), tellurium (Te), arsenic (As), antimony (Sb), carbon (C), germanium (Ge), and silicon (Si). A chalcogenide material can primarily have selenium (Se), arsenic (As), and germanium (Ge) and be referred to as SAG-alloy. SAG-alloy can include silicon (Si) and be referred to as SiSAG-alloy. In some embodiments, the chalcogenide glass can include additional elements such as hydrogen (H), oxygen (O), nitrogen (N), chlorine (Cl), or fluorine (F), each in atomic or molecular forms. The selector/memory device has a top side and a bottom side. A top electrode is formed on the top side of the selector/memory device for connecting to a bitline 141; and a bottom electrode is formed on the bottom side of the selector/memory device for connecting to a wordline 143. For example, the top and bottom electrodes can be formed of a carbon material. For example, a chalcogenide material of the memory cell 101 can take the form of a crystalline atomic configuration or an amorphous atomic configuration. The threshold voltage of the memory cell 101 can be dependent on the ratio of the material in the crystalline configuration and the material of the amorphous configuration in the memory cell 101. The ratio can change under various conditions (e.g., having currents of different magnitudes and directions going through the memory cell 101).

A self-selecting memory cell 101, having a selector/memory device, can be programmed to have a threshold voltage window. The threshold voltage window can be created by applying programming pulses with opposite polarity to the selector/memory device. For example, the memory cell 101 can be biased to have a positive voltage difference between two sides of the selector/memory device and alternatively, or to have a negative voltage difference between the same two sides of the selector/memory device. When the positive voltage difference is considered in positive polarity, the negative voltage difference is considered in negative polarity that is opposite to the positive polarity. Reading can be performed with a given/fixed polarity. When programmed, the memory cell has a low threshold (e.g., lower than the cell that has been reset, or a cell that has been programmed to have a high threshold), such that during a read operation, the read voltage can cause a programmed cell to snap and thus become conductive while a reset cell remains non-conductive.

For example, to program the voltage threshold of the memory cell 101, the bitline driver 147 and the wordline driver 145 can drive a pulse of voltage onto the memory cell 101 in one polarity (e.g., positive polarity) to snap the memory cell 101 such that the memory cell 101 is in a conductive state. While the memory cell 101 is conductive, the bitline driver 147 and the wordline driver 145 continue driving the programming pulse to change the threshold voltage of the memory cell 101 towards a voltage region that represents the data or bit value(s) to be stored in the memory cell 101.

The controller 131 can be configured in an integrated circuit having a plurality of decks of memory cells. Each deck can be sandwiched between a layer of bitlines, a layer of wordlines; and the memory cells in the deck can be arranged in an array 133. A deck can have one or more arrays or tiles. Adjacent decks of memory cells may share a layer of bitlines (e.g., 141) or a layer of wordlines (e.g., 143). Bitlines are arranged to run in parallel in their layer in one direction; and the wordlines are arranged to run in parallel in their layer in another direction orthogonal to the direction of the bitlines. Each of the bitlines is connected to a row of memory cells in the array; and each of the wordlines is connected to a column of memory cells in the array. Bitline drivers 137 are connected to bitlines in the decks; and wordline drivers 135 are connected to wordlines in the decks. Thus, a typical memory cell 101 is connected to a bitline driver 147 and a wordline driver 145.

The threshold voltage of a typically memory cell 101 is configured to be sufficiently high such that when only one of its bitline driver 147 and wordline driver 145 drives a voltage in either polarity while the other voltage driver holds the respective line to the ground, the magnitude of the voltage applied across the memory cell 101 is insufficient to cause the memory cell 101 to become conductive. Thus, addressing the memory cell 101 can be performed via both of its bitline driver 147 and wordline driver 145 driving a voltage in opposite polarity relative to the ground for operating/selecting the memory cell 101. Other memory cells connected to the same wordline driver 145 can be de-selected by their respective bitline drivers holding the respective bitlines to the ground; and other memory cells connected to the same bitline driver can be de-selected by their respective wordline drives holding the respective wordlines to the ground.

A group of memory cells (e.g., 101) connected to a common wordline driver 145 can be selected for parallel operation by their respective bitline drivers (e.g., 147) driving up the magnitude of voltages in one polarity while the wordline driver 145 is also driving up the magnitude of a voltage in the opposite polarity. Similarly, a group of memory cells connected to a common bitline driver 147 can be selected for parallel operation by their respective wordline drivers (e.g., 145) driving voltages in one polarity while the bitline driver 147 is also driving a voltage in the opposite polarity.

At least some examples are disclosed herein in reference to a cross-point memory having self-selecting memory cells. Other types of memory cells and/or memory can also be used. For example, memory cells each having a selector device and a phase-change memory device and/or flash memory cells can also be used in at least some embodiments.

Figure 3:
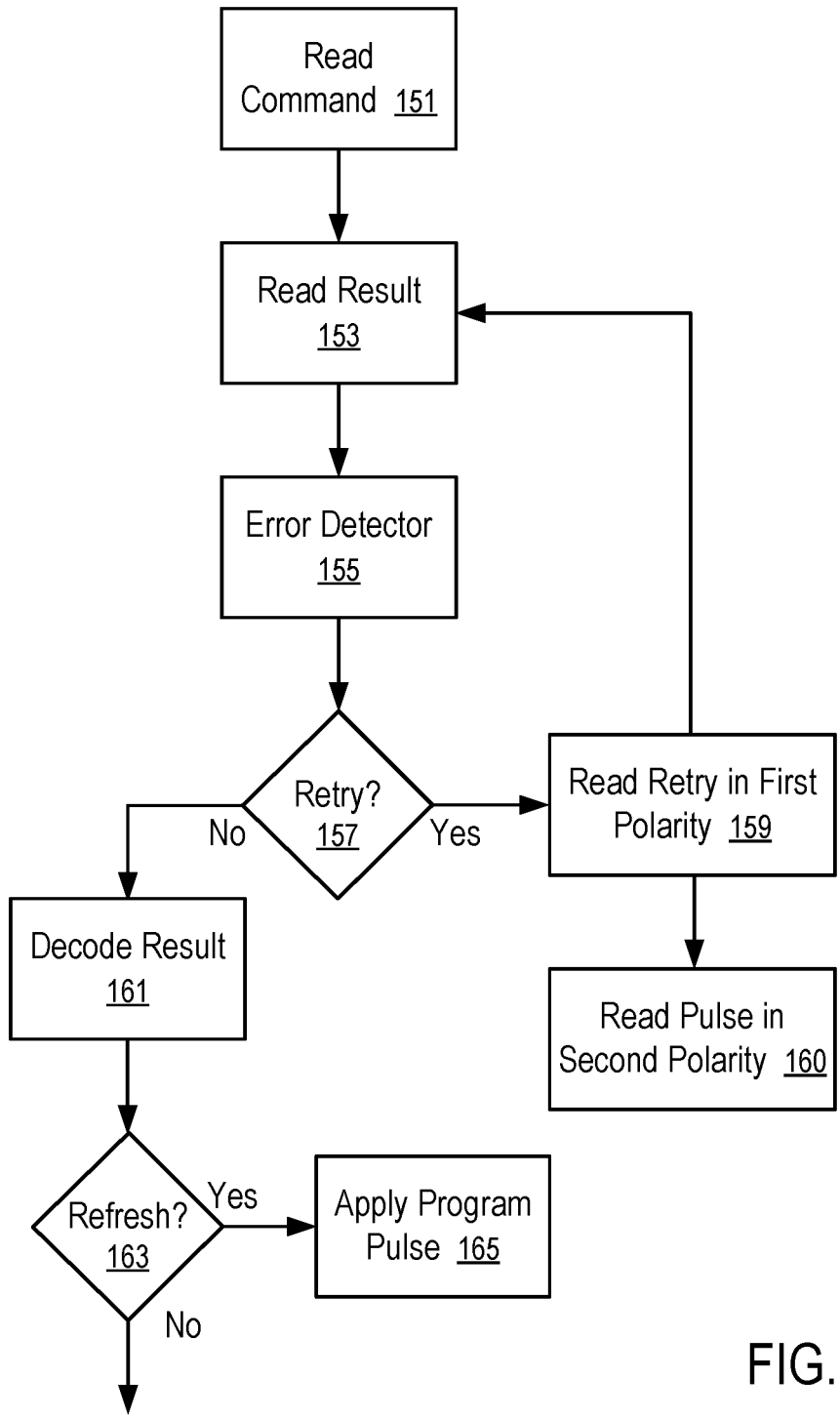
FIG. 3 shows a technique to operate a memory cell according to one embodiment.

FIG. 3 shows a technique to operate a memory cell according to one embodiment. For example, the technique of FIG. 3 can be implemented using a read manager 113 illustrated in FIGS. 1 and 2.

In FIG. 3, a read command 151 identifies a set of memory cells (e.g., 101) to retrieve a data item represented by the threshold voltages of the memory cells (e.g., 101). In response to the read command 151, the read manager 113 instructs the voltage drivers (e.g., bitline drivers 137 and wordline drivers 135) to apply voltages to the memory cells (e.g., 101) to obtain read results 153 according to the classifications of voltage regions of the threshold voltages of the memory cells (e.g., 101) determined using a read voltage.

An error detector 155 can analyze the read result 153 to detect errors in the read result 153 (e.g., using an Error Correction Code (ECC) technique). When the bit error rate in the read result 153 exceeds the capability of the error detector 155 to identify an error free data item, the read manager 113 can decide 157 to perform a read retry 159 in a first polarity.

For example, the threshold voltages of the set of memory cells may have drifted to have a higher magnitude. Thus, using a read voltage having a lower magnitude to classify the voltage regions of the threshold voltages of the memory cells (e.g., 101) can lead to erroneous read result 153. In the read retry, a read voltage with an increased magnitude can be reapplied to the set of memory cells (e.g., 101) to obtain an updated read result 153. While the updated read result 153 is being sent to the error detector 155 for analysis, the read manager 113 can instruct the voltage drivers (e.g., bitline drivers 137 and wordline drivers 135) to apply a read pulse 160 in the second polarity according to the increased magnitude. The application of the read pulse 160 can reduce or eliminate impacts on readability of the memory cells, as illustrated in FIGS. 4-9.

When the read manager 113 decides 157 not to perform a read retry, the decode result 161 can be provided as a response to the read command 151.

After a period of operations, the read manager 113 can decide 163 to perform a refresh operation. In the refresh operation, the read manager 113 can determine a desirable voltage region of the threshold voltage of a memory cell (e.g., 101) and apply 165 a program pulse to the memory cell (e.g., 101) to program the threshold voltage of the memory cell (e.g., 101) to the voltage region.

FIGS. 4 to 9 illustrate changes of threshold voltage distributions resulting from sequences of voltage pulses applied according to some embodiment.

FIGS. 4 to 9 show normal quantile (NQ) plots representing the statistical distributions (e.g., 171 to 178) of threshold voltages of memory cells. When a probability distribution (e.g., 171) of threshold voltage programmed in a region is a normal distribution (also known as Gaussian distribution), its normal quantile (NQ) plot is seen as aligned on a straight line (e.g., distribution 171).

A self-selecting memory cell (e.g., 101) can have a threshold voltage in negative polarity and a threshold voltage in positive polarity. When a voltage applied on the memory cell 101 in either polarity is increased in magnitude up to its threshold voltage in the corresponding polarity, the memory cell (e.g., 101) snaps from a non-conductive state to a conductive state.

The threshold voltage of a memory cell 101 in negative polarity and the threshold voltage of the memory cell 101 in positive polarity can have different magnitudes. Memory cells programmed to have large magnitudes in threshold voltages in positive polarity can have small magnitudes in threshold voltages in negative polarity; and memory cells programmed to have small magnitudes in threshold voltages in positive polarity can have large magnitudes in threshold voltages in negative polarity.

For example, a memory cell can be programmed to have a small magnitude in threshold voltage according to distribution 174 in the positive polarity to represent a value (e.g., one); and as a result, its threshold voltage has a large magnitude according to distribution 173 in the negative polarity to represent the same value (e.g., one). Alternatively, the memory cell can be programmed to have a large magnitude in threshold voltage according to distribution 172 in the positive polarity to represent another value (e.g., zero); and as a result, its threshold voltage has a smaller magnitude according to distribution 171 in the negative polarity to represent the same value (e.g., zero).

Thus, to determine whether a memory cell 101 is storing the one value (e.g., one) or the other value (e.g., zero), the read manager 113 can read the memory cell 101 in either the positive polarity or the negative polarity. If the threshold voltage of the memory cell 101 has a large magnitude according to distribution 172 in the positive polarity, it stores the other value (e.g., zero); otherwise, it stores the one value (e.g., one). Similarly, if the threshold voltage of the memory cell 101 has a large magnitude according to distribution 173 in the negative polarity, it stores the one value (e.g., one); otherwise, it stores the other value (e.g., zero).

Figure 4:
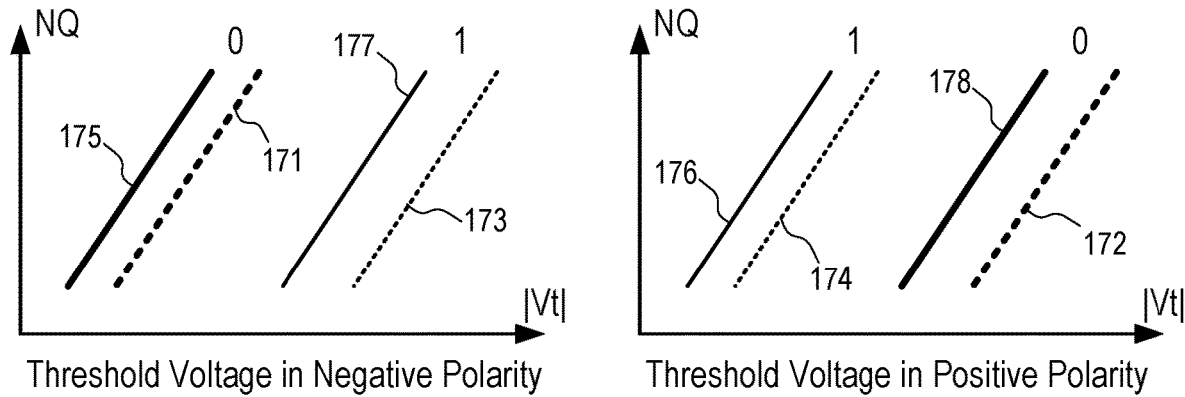
FIGS. 4 to 9 illustrate changes of threshold voltage distributions resulting from sequences of voltage pulses applied according to some embodiment.

FIG. 4 illustrates the change of threshold voltage distributions of memory cells after a bipolar read retry. In the positive polarity, the bipolar read retry causes the high magnitude distribution 172 to shift downward to distribution 178, and the low magnitude distribution 174 to shift downward to distribution 176. As a result, the voltage region of the low magnitude distribution 176 and the voltage region of the high magnitude distribution 178 remain well separated in the positive polarity.

Similarly, in negative polarity, the bipolar read retry causes the high magnitude distribution 173 to shift downward to distribution 177, and the low magnitude distribution 171 to shift downward to distribution 175. As a result, the voltage region of the low magnitude distribution 175 and the voltage region of the high magnitude distribution 177 are also well separated in the negative polarity.

Figure 5:
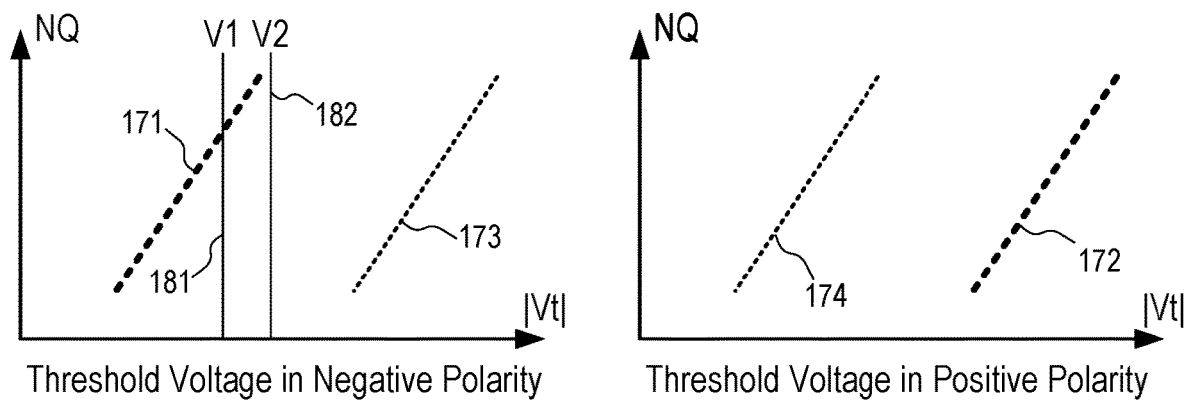

FIG. 5 illustrates the detection of a drift in threshold voltages and an increased magnitude of read voltage for read retry to account for the drift.

For example, in response to a read command 151, a read result 153 is obtained using a read voltage V1 181 in the negative polarity. Since the read voltage V1 is located within the voltage region of the low magnitude distribution 171 representing the other value (e.g., zero), some memory cells programmed to be in the distribution 171 to represent the other value (e.g., zero) can remain non-conductive when the read voltage V1 is applied. As a result, when the read voltage V1 is used, such memory cells are incorrectly classified as being associated with the high magnitude distribution 173 and storing the one value (e.g., one). The presence of a high bit error rate in the read result 153 can be detected in the error detector 155. In response, the read manager 113 can decide 157 to perform a read retry using a read voltage V2 182 having a magnitude greater than the read voltage V1 181.

When the read voltage V2 used in the read retry is above the voltage region of the low magnitude distribution 171, the updated read result 153 contains no erroneous bits; and a correct decode result 161 can be generated as a response to the read command 151.

Figure 6:
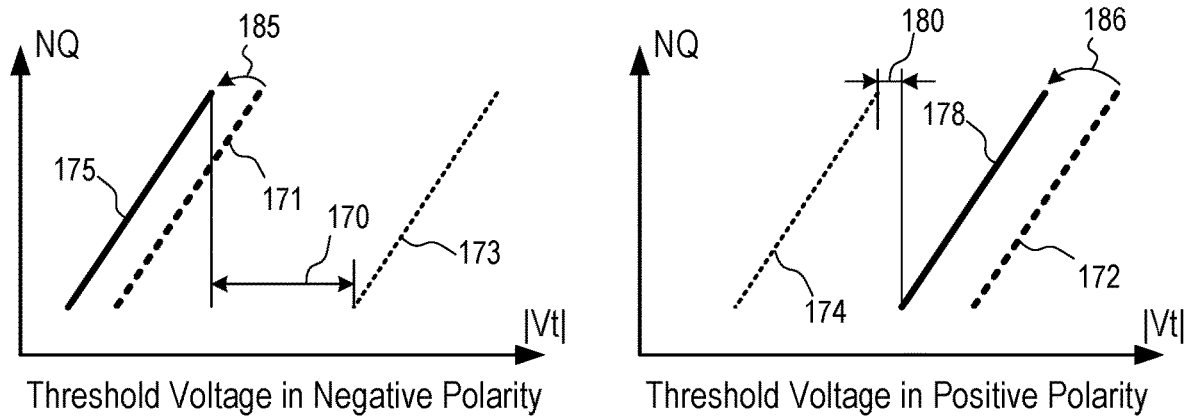

The application of read voltage V2 in the negative polarity can cause the voltage distributions of the memory cells storing the other value (e.g., zero) to shift, as illustrated in FIG. 6.

Memory cells storing the other value (e.g., zero) have the low magnitude distribution 171 in the negative polarity and thus become conductive during the read retry using the read voltage V2 in the negative polarity. The threshold voltages of such memory cells can shift 185 down to a distribution 175 in the negative polarity. Their threshold voltages in the positive polarity also shift 186 down to a distribution 178.

Memory cells programmed to have the high magnitude distribution 173 remains non-conductive during the read retry in the negative polarity using the read voltage V2. Thus, the distributions of the threshold voltages of such memory cells can remain substantially the same as the high magnitude distribution 173 in the negative polarity and the low magnitude distribution 174 in the positive polarity.

As a result of applying the read voltage V2 in the negative polarity for read retry, the voltage window 170 usable to tell the distributions 175 and 173 apart in the negative polarity is enlarged. However, the voltage window 180 to tell the distributions 174 and 178 apart in the positive polarity is reduced.

When the read voltage V2 in the negative polarity is applied in read retry, the memory cells programmed to the high magnitude distribution 173 are not uniformly disturbed. Memory cells having threshold voltages closer the read voltage V2 are disturbed more than memory cells having threshold voltages much higher than the read voltage V2 in magnitude. As a result, the distribution 173 can be disturbed as illustrated in FIG. 7.

Figure 7:
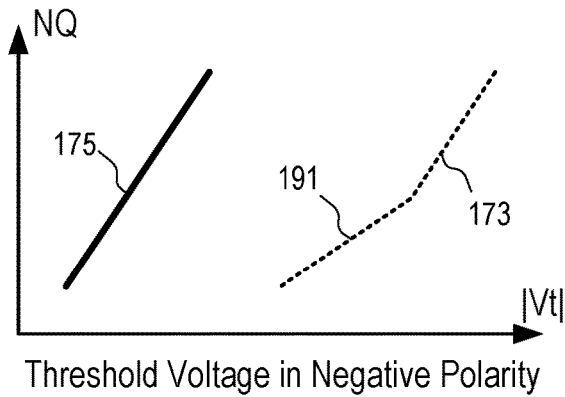
Figure 7:
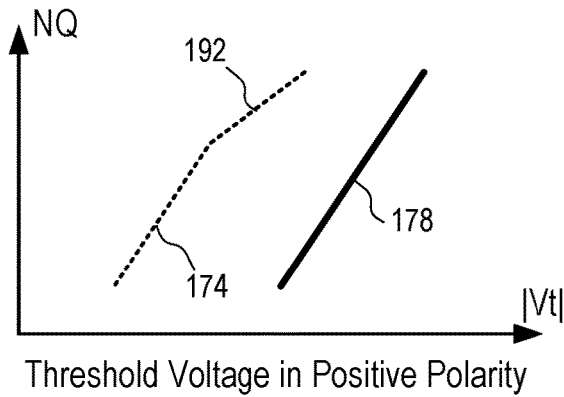

As illustrated in FIG. 7, read disturb causes a lower portion 191 of the distribution 173 to move towards lower voltage magnitudes in the negative polarity, which causes an upper portion 192 of the distribution 174 to move towards higher voltage magnitudes in the positive polarity.

The effect of the read disturb is generally small. However, when read retry is repeated in the negative polarity, the accumulated read disturb can rapidly reduce the voltage window usable to tell the distributions 174 and 178 in the positive polarity.

Figure 8:
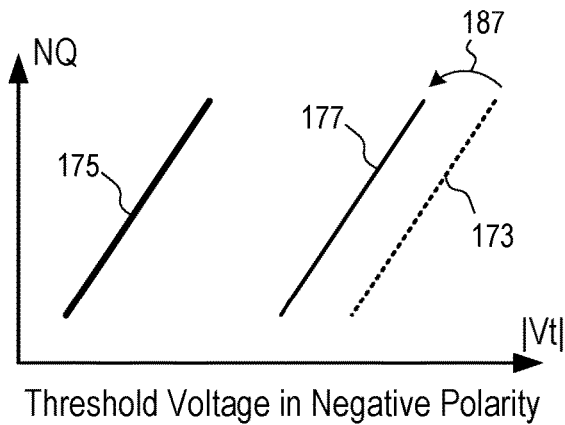
Figure 8:
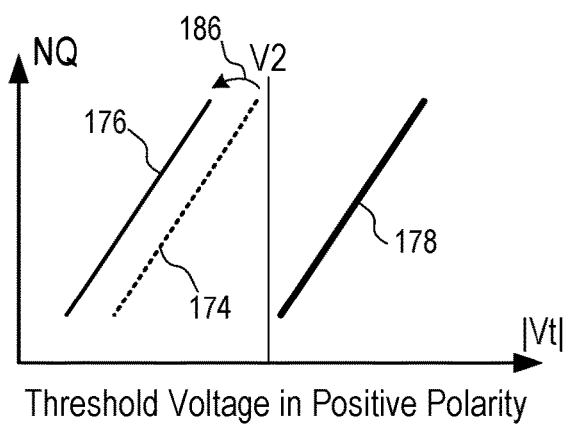

FIG. 8 illustrates the changes caused by a further read pulse 160 applied in a bipolar read retry. In FIG. 8, a read voltage V2 having a same magnitude of the voltage V1 used in the initial operation of read retry illustrated in FIG. 4 is applied in the positive polarity. The read voltage V2 applied in the positive polarity causes the memory cells programmed to the distribution 174 to shift 186 downwards to a distribution 176. As a result, the distribution 173 of their threshold voltages in the negative polarity also shifts 187 downwards to a distribution 177.

Figure 9:
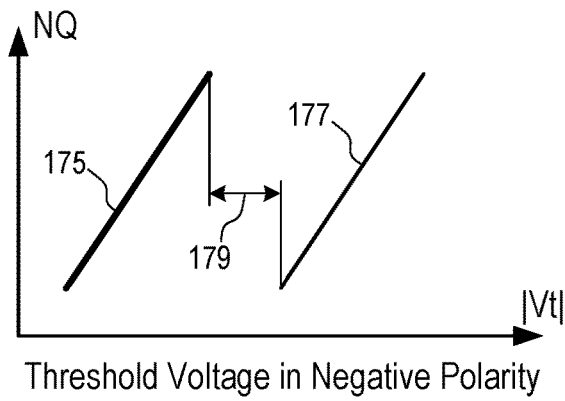
Figure 9:
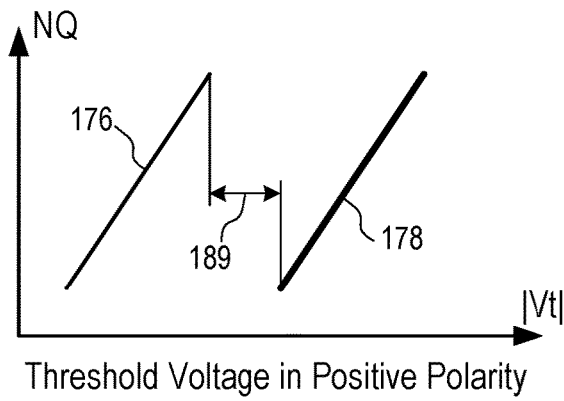

FIG. 9 illustrates the resulting distributions 175, 177, 176 and 178 after a bipolar read retry. The voltage window 179 can be used to tell the low magnitude distribution 175 and the high magnitude distribution 177 apart in the negative polarity; and the voltage window 189 can be used to tell the low magnitude distribution 176 and the high magnitude distribution 178 apart in the positive polarity. The sizes of the voltage windows 179 and 189 are well maintained and balanced over the two polarities. Thus, the memory cells can be read in either the positive polarity or the negative polarity for accurate results.

Figure 10:
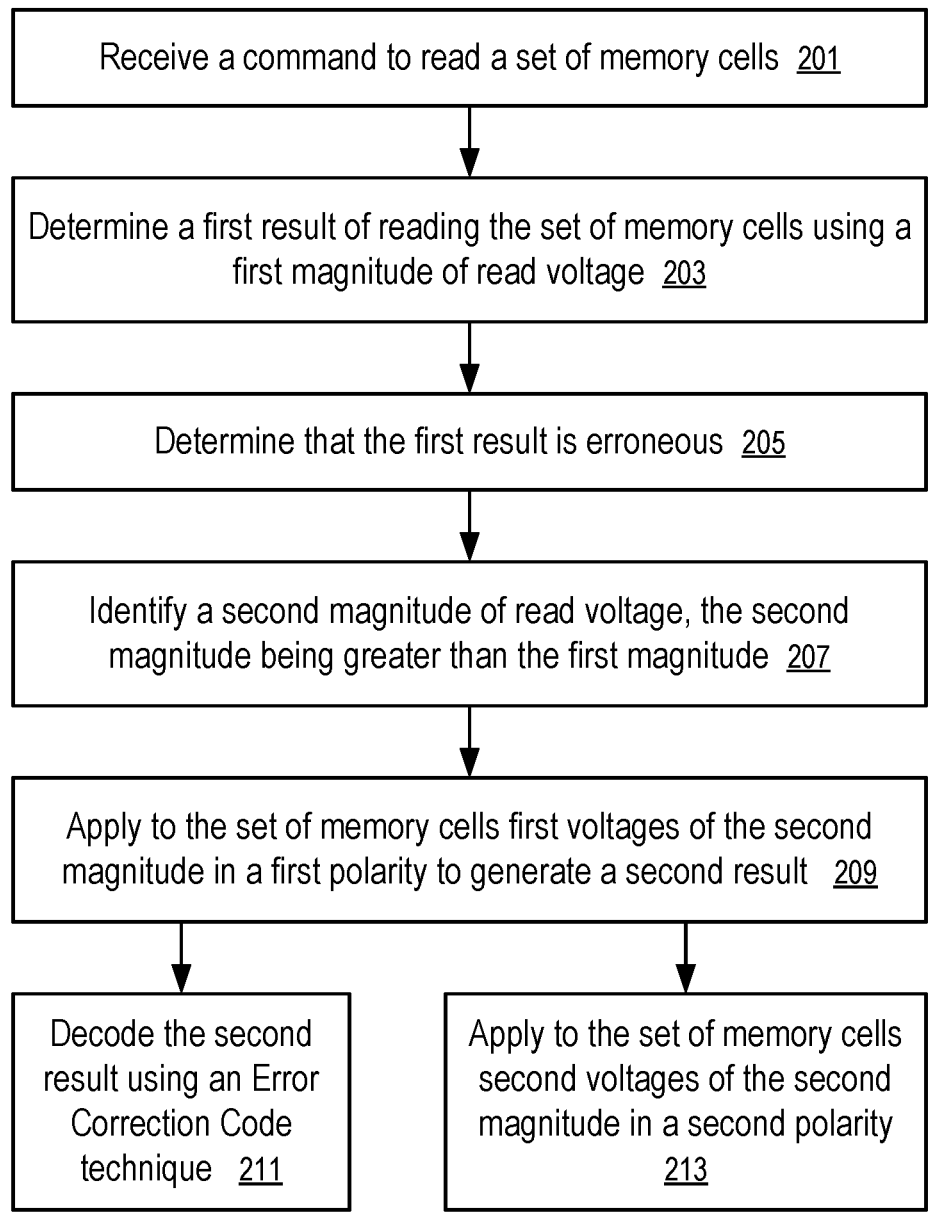
FIG. 10 shows a method to read memory cells using bipolar read retry according to one embodiment.

FIG. 10 shows a method to read memory cells using bipolar read retry according to one embodiment. For example, the method of FIG. 10 can be implemented in a memory device 130 of FIG. 1 having a controller 131 with a read manager 113, as illustrated in FIGS. 1 and 2, using the technique of FIG. 3 with characteristics of threshold voltages illustrated in FIGS. 4 to 9.

At block 201, a memory device 130 receive a command to read a set of memory cells (e.g., 101).

At block 203, a read manager 113 determines a first result of reading the set of memory cells using a first magnitude (e.g., V1) of read voltage.

At block 205, a decoder (e.g., error detector 155) determines that the first result is erroneous.

For example, decoding the first result using the Error Correction Code (ECC) technique can indicate that the first result has too many bit errors for successful decoding.

At block 207, the read manager 113 identifies a second magnitude (e.g., V2) of read voltage. The second magnitude (e.g., V2) is greater than the first magnitude (e.g., V1).

For example, the set of memory cells can include a first subset configured to each store a first value (e.g., zero) and a second subset configured to each store a second value (e.g., one). The second magnitude (e.g., V2) is increased from the first magnitude (e.g., V1), such that in the first polarity (e.g., negative polarity) threshold voltages of the first subset are in a first region (e.g., the voltage region of the distribution 171); and the first region is lower than the second magnitude (e.g., V2) and associated with the first value. Similarly, in the first polarity (e.g., negative polarity), the threshold voltages of the second subset are in a second region (e.g., the voltage region of the distribution 173); and the second region is higher than the second magnitude (V2) and associated with the second value (e.g., one).

At the same time, in the second polarity (e.g., positive polarity), threshold voltages of the first subset are in a fourth region (e.g., the voltage region of the distribution 172) higher than the second magnitude (e.g., V2) and associated with the first value (e.g., zero); and threshold voltages of the second subset are in a third region (e.g., the voltage region of the distribution 174) lower than the second magnitude (e.g., V2) and associated with the second value (e.g., one).

A determination that the first result is erroneous is representative of an indication that: the first region (e.g., of the distribution 171) is partially above the first magnitude (e.g., V1) in the first polarity (e.g., negative polarity); and the third region (e.g., of the distribution 174) is partially above the first magnitude (e.g., V1) in the second polarity (e.g., positive polarity).

At block 209, the controller 131 of the memory device 130 applies, to the set of memory cells, first voltages of the second magnitude (e.g., V2) in a first polarity (e.g., negative polarity) to generate a second result.

Operations in blocks 211 and 213 can be performed in parallel and/or concurrently.

At block 211, a decoder (e.g., error detector 155) decodes the second result using an Error Correction Code technique.

At block 213, the controller 131 applies, to the set of memory cells, second voltages of the second magnitude (e.g., V2) in a second polarity (e.g., positive polarity).

Since the blocks 211 and 213 are preformed concurrently, the second result is independent from applying of the second voltages of the second magnitude (e.g., V2) in the second polarity (e.g., positive polarity). Thus, the decode result 161 generated from decoding the second result is not delayed by the applying of the second voltages of the second magnitude (e.g., V2) in the second polarity (e.g., positive polarity).

As illustrated in FIGS. 4, 6 and 8, the first voltages of the second magnitude (e.g., V2) applied to the set of memory cell in the first polarity (e.g., negative polarity) cause the first region (e.g., the voltage region of the distribution 171) to shift downward in magnitude of voltage (e.g., towards the distribution 175) and cause the fourth region (e.g., the voltage region of the distribution 172) to shift downward in magnitude of voltage (e.g., towards the distribution 178); and the second voltages of the second magnitude (e.g., V2) applied to the set of memory cells in the second polarity (e.g., positive polarity) cause the second region (e.g., the voltage region of the distribution 173) to shift downward in magnitude of voltage (e.g., towards distribution 177) and cause the third region (e.g., the voltage region of the distribution 174) to shift downward in magnitude of voltage (e.g., towards the distribution 176).

As a result of the bipolar read retry, the voltage windows (e.g., 179 and 189 in FIG. 9) to tell apart distributions of memory cells storing different values are well maintained in both polarities and balanced for the two polarities.

Figure 11:
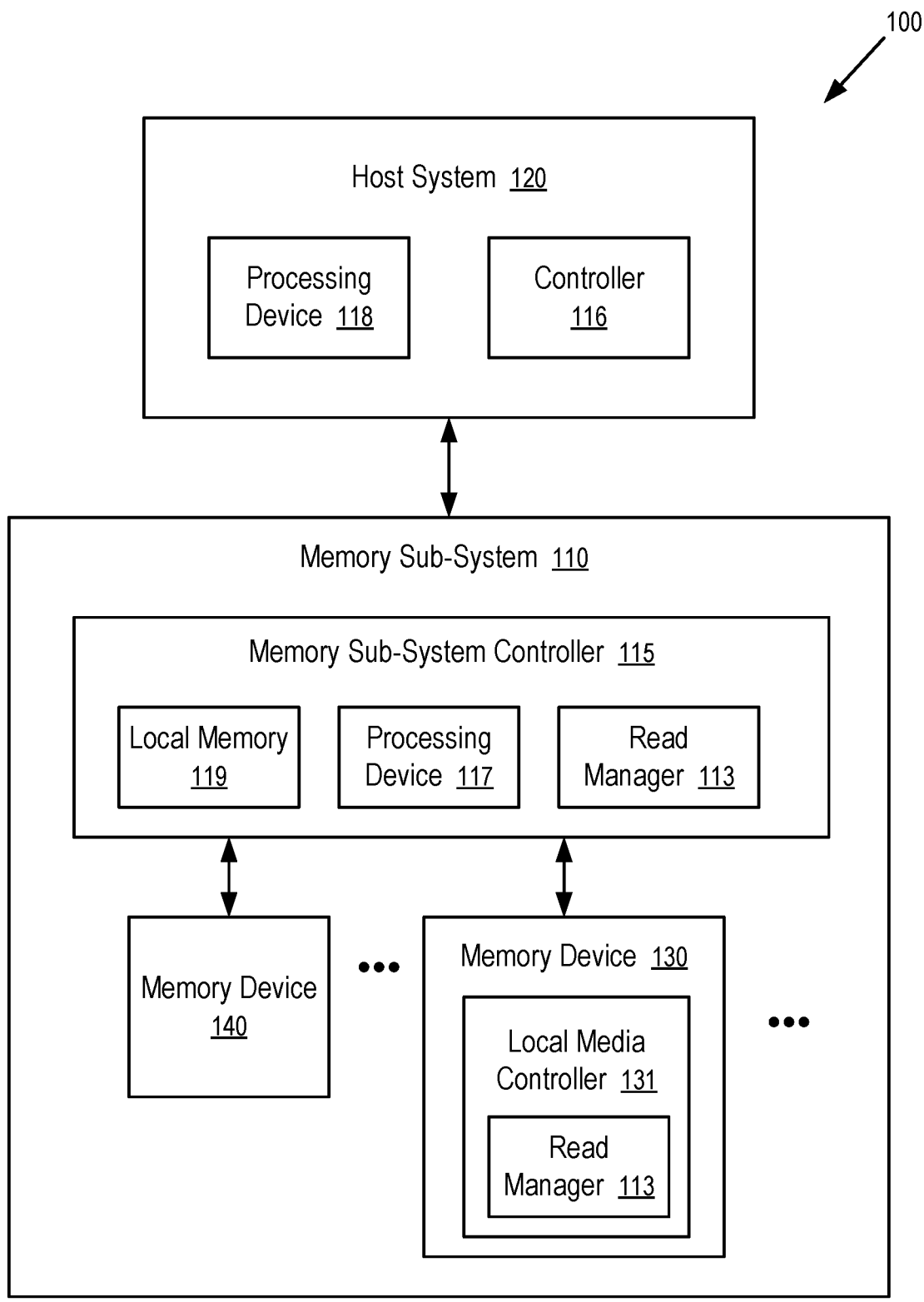
FIG. 11 illustrates an example computing system having a memory sub-system in accordance with some embodiments of the present disclosure.

FIG. 11 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130 of FIG. 1), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or such a computing device that includes memory and a processing device.

The computing system 100 can include a host system 120 that is coupled to one or more memory sub-systems 110. FIG. 11 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset (e.g., processing device 118) and a software stack executed by the processor chipset. The processor chipset can include one or more cores, one or more caches, a memory controller (e.g., controller 116) (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, a universal serial bus (USB) interface, a Fibre Channel, a Serial Attached SCSI (SAS) interface, a double data rate (DDR) memory bus interface, a Small Computer System Interface (SCSI), a dual in-line memory module (DIMM) interface (e.g., DIMM socket interface that supports Double Data Rate (DDR)), an Open NAND Flash Interface (ONFI), a Double Data Rate (DDR) interface, a Low Power Double Data Rate (LPDDR) interface, or any other interface. The physical host interface can be used to transmit data between the host system 120 and the memory sub-system 110. The host system 120 can further utilize an NVM Express (NVMe) interface to access components (e.g., memory devices 130 of FIG. 1) when the memory sub-system 110 is coupled with the host system 120 by the PCIe interface. The physical host interface can provide an interface for passing control, address, data, and other signals between the memory sub-system 110 and the host system 120. FIG. 11 illustrates a memory sub-system 110 as an example. In general, the host system 120 can access multiple memory sub-systems via a same communication connection, multiple separate communication connections, and/or a combination of communication connections.

The processing device 118 of the host system 120 can be, for example, a microprocessor, a central processing unit (CPU), a processing core of a processor, an execution unit, etc. In some instances, the controller 116 can be referred to as a memory controller, a memory management unit, and/or an initiator. In one example, the controller 116 controls the communications over a bus coupled between the host system 120 and the memory sub-system 110. In general, the controller 116 can send commands or requests to the memory sub-system 110 for desired access to memory devices 130, 140. The controller 116 can further include interface circuitry to communicate with the memory sub-system 110. The interface circuitry can convert responses received from memory sub-system 110 into information for the host system 120.

The controller 116 of the host system 120 can communicate with controller 115 of the memory sub-system 110 to perform operations such as reading data, writing data, or erasing data at the memory devices 130, 140 and other such operations. In some instances, the controller 116 is integrated within the same package of the processing device 118. In other instances, the controller 116 is separate from the package of the processing device 118. The controller 116 and/or the processing device 118 can include hardware such as one or more integrated circuits (ICs) and/or discrete components, a buffer memory, a cache memory, or a combination thereof. The controller 116 and/or the processing device 118 can be a microcontroller, special purpose logic circuitry (e.g., a field programmable gate array (FPGA), an application specific integrated circuit (ASIC), etc.), or another suitable processor.

The memory devices 130, 140 can include any combination of the different types of non-volatile memory components and/or volatile memory components. The volatile memory devices (e.g., memory device 140) can be, but are not limited to, random access memory (RAM), such as dynamic random access memory (DRAM) and synchronous dynamic random access memory (SDRAM).

Some examples of non-volatile memory components include a negative-and (or, NOT AND) (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs, or any combination of such. In some embodiments, a particular memory device can include an SLC portion, an MLC portion, a TLC portion, a QLC portion, and/or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as 3D cross-point type and NAND type memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations (e.g., in response to commands scheduled on a command bus by controller 116). The controller 115 can include hardware such as one or more integrated circuits (ICs) and/or discrete components, a buffer memory, or a combination thereof. The hardware can include digital circuitry with dedicated (e.g., hard-coded) logic to perform the operations described herein. The controller 115 can be a microcontroller, special purpose logic circuitry (e.g., a field programmable gate array (FPGA), an application specific integrated circuit (ASIC), etc.), or another suitable processor.

The controller 115 can include a processing device 117 (e.g., processor) configured to execute instructions stored in a local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 11 has been illustrated as including the controller 115, in another embodiment of the present disclosure, a memory sub-system 110 does not include a controller 115, and can instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory devices 130. The controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory devices 130.

In some embodiments, the memory devices 130 include local media controllers 131 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local media controller 131) for media management within the same memory device package. An example of a managed memory device is a managed NAND (MNAND) device.

The controller 115 and/or a memory device 130 can include a read manager 113, such as the read manager 113 discussed above in connection with FIGS. 1 to 10. In some embodiments, the controller 115 in the memory sub-system 110 includes at least a portion of the read manager 113. In other embodiments, or in combination, the controller 116 and/or the processing device 118 in the host system 120 includes at least a portion of the read manager 113. For example, the controller 115, the controller 116, and/or the processing device 118 can include logic circuitry implementing the read manager 113. For example, the controller 115, or the processing device 118 (e.g., processor) of the host system 120, can be configured to execute instructions stored in memory for performing the operations of the read manager 113 described herein. In some embodiments, the read manager 113 is implemented in an integrated circuit chip (e.g., memory device 130) installed in the memory sub-system 110. In other embodiments, the read manager 113 can be part of firmware of the memory sub-system 110, an operating system of the host system 120, a device driver, or an application, or any combination therein.

Figure 12:
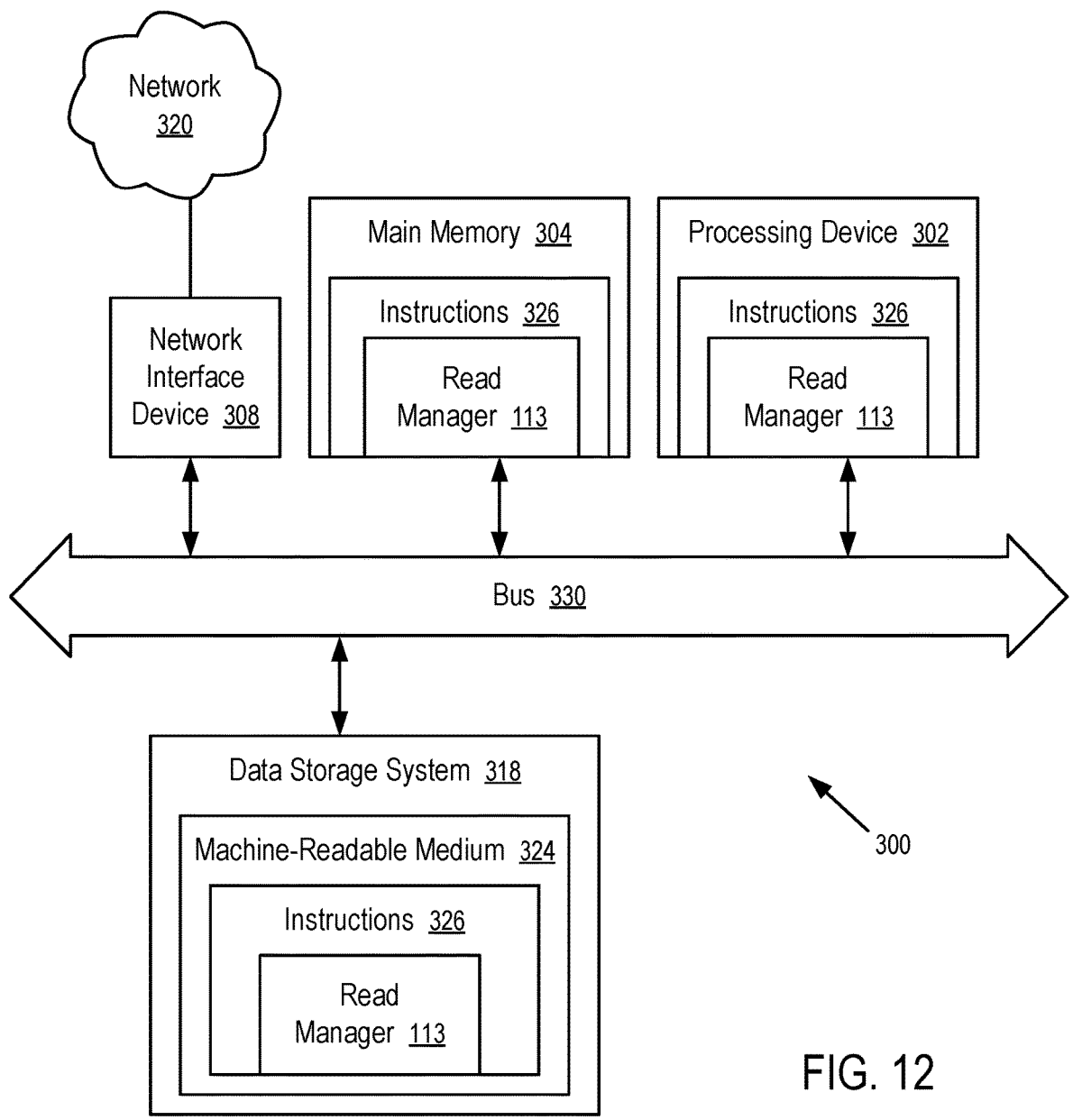
FIG. 12 is a block diagram of an example computer system in which embodiments of the present disclosure can operate.

FIG. 12 illustrates an example machine of a computer system 300 within which a set of instructions, for causing the machine to perform any one or more of the methodologies discussed herein, can be executed. In some embodiments, the computer system 300 can correspond to a host system (e.g., the host system 120 of FIG. 11) that includes, is coupled to, or utilizes a memory sub-system (e.g., the memory sub-system 110 of FIG. 11) or can be used to perform the operations of a read manager 113 (e.g., to execute instructions to perform operations corresponding to the read manager 113 described with reference to FIGS. 1-10). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 300 includes a processing device 302, a main memory 304 (e.g., read-only memory (ROM), flash memory, dynamic random access memory (DRAM) such as synchronous DRAM (SDRAM) or Rambus DRAM (RDRAM), static random access memory (SRAM), etc.), and a data storage system 318, which communicate with each other via a bus 330 (which can include multiple buses).

Processing device 302 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 302 can also be one or more special-purpose processing devices such as an application specific integrated circuit (ASIC), a field programmable gate array (FPGA), a digital signal processor (DSP), network processor, or the like. The processing device 302 is configured to execute instructions 326 for performing the operations and steps discussed herein. The computer system 300 can further include a network interface device 308 to communicate over the network 320.

The data storage system 318 can include a machine-readable medium 324 (also known as a computer-readable medium) on which is stored one or more sets of instructions 326 or software embodying any one or more of the methodologies or functions described herein. The instructions 326 can also reside, completely or at least partially, within the main memory 304 and/or within the processing device 302 during execution thereof by the computer system 300, the main memory 304 and the processing device 302 also constituting machine-readable storage media. The machine-readable medium 324, data storage system 318, and/or main memory 304 can correspond to the memory sub-system 110 of FIG. 11.

In one embodiment, the instructions 326 include instructions to implement functionality corresponding to a read manager 113 (e.g., the read manager 113 described with reference to FIGS. 1-10). While the machine-readable medium 324 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD- ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In this description, various functions and operations are described as being performed by or caused by computer instructions to simplify description. However, those skilled in the art will recognize what is meant by such expressions is that the functions result from execution of the computer instructions by one or more controllers or processors, such as a microprocessor. Alternatively, or in combination, the functions and operations can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A device, comprising:
    a set of memory cells;
    voltage drivers connected to the memory cells; and
    a controller coupled to the voltage drivers and configured to use the voltage drivers to operate on the memory cells;
    wherein, in response to a determination that a first result of reading the set of memory cells using a first magnitude of read voltage is erroneous, the controller is configured to:
        determine a second magnitude of read voltage, the second magnitude being greater than the first magnitude;
        apply, using the voltage drivers, first voltages of the second magnitude to the set of memory cells in a first polarity to obtain a second result of reading the set of memory cells; and
        apply, using the voltage drivers, second voltages of the second magnitude to the set of memory cells in a second polarity, opposite to the first polarity, after the second result is generated;
    wherein the set of memory cells includes a first subset and a second subset threshold voltages of the first subset are programmed to be in a first region in the first polarity to represent a first value; threshold voltages of the second subset are programmed to be in a second region in the first polarity to represent a second value; and the first region is lower than the second region in magnitude of voltage;
    wherein threshold voltages of the first subset are in a third region in the second polarity to represent the second value; threshold voltages of the second subset are in a fourth region in the second polarity to represent the first value; and the third region being lower than the fourth region in magnitude of voltage.

2. The device of claim 1, wherein the controller includes a decoder configured to detect errors in the second result of reading the set of memory cells using an Error Correction Code (ECC) technique; and the second voltages of the second magnitude are applied in the second polarity to the set of memory cells while the decoder detects error in the second result.

3. The device of claim 1, wherein the second voltages of the second magnitude are applied in the second polarity to the set of memory cells after the second result is provided to a decoder configured to detect errors in the second result of reading the set of memory cells using an Error Correction Code (ECC) technique.

4. The device of claim 1, wherein the first voltages of the second magnitude applied to the set of memory cells in the first polarity cause the first region to shift downward in magnitude of voltage and cause the fourth region to shift downward in magnitude of voltage.

5. The device of claim 4, wherein the second voltages of the second magnitude applied to the set of memory cells in the second polarity cause the second region to shift downward in magnitude of voltage and cause the third region to shift downward in magnitude of voltage.

6. A method, comprising:
    receiving a command to read a set of memory cells;
    determining a first result of reading the set of memory cells using a first magnitude of read voltage;
    determining that the first result is erroneous;
    identifying a second magnitude of read voltage, the second magnitude being greater than the first magnitude; and
    determining a second result of reading the set of memory cells using the second magnitude, including applying, to the set of memory cells, first voltages of the second magnitude in a first polarity and second voltages of the second magnitude in a second polarity opposite to the first polarity;
    wherein the set of memory cells includes a first subset and a second subset; when the first result is determined to be erroneous:

threshold voltages of the first subset are in a first region in the first polarity, the first region being lower than the second magnitude and associated with a first value; and threshold voltages of the second subset are in a second region in the first polarity, the second region being higher than the second magnitude and associated with a second value.

7. The method of claim 6, wherein the second result is independent from applying the second voltages of the second magnitude in the second polarity.

8. The method of claim 7, further comprising:
decoding the second result using an Error Correction Code (ECC) technique in parallel with the applying of the second voltages of the second magnitude in the second polarity.

9. The method of claim 8, wherein the determining that the first result is erroneous includes decoding the first result using the Error Correction Code (ECC) technique.

10. The method of claim 6, wherein when the first result is determined to be erroneous:

threshold voltages of the first subset are in a fourth region in the second polarity, a third region being higher than the second magnitude and associated with the first value; and threshold voltages of the second subset are in the third region in the second polarity, the fourth region being lower than the second magnitude and associated with the second value.

11. The method of claim 10, wherein a determination that the first result is erroneous is representative of an indication that:

the first region is partially above the first magnitude in the first polarity; and the third region is partially above the first magnitude in the second polarity.

12. The method of claim 6, wherein the first voltages of the second magnitude applied to the set of memory cells in the first polarity cause the first region to shift downward in magnitude of voltage and cause a fourth region to shift downward in magnitude of voltage; and the second voltages of the second magnitude applied to the set of memory cells in the second polarity cause the second region to shift downward in magnitude of voltage and cause a third region to shift downward in magnitude of voltage.

13. An integrated circuit, comprising:
a layer of bitlines;
a layer of wordlines;
memory cells configured between the layer of bitlines and the layer of wordlines, each of the memory cells connected to a bitline among the bitlines and to a wordline among the wordlines;
bitline drivers connected to the bitlines;
wordline drivers connected to the wordlines; and
a controller coupled to the bitline drivers and the wordline drivers and configured to, in response to a command to retrieve data from a first memory cell among the memory cells,
read the first memory cell using a first magnitude of read voltage; and
in response to an error associated with a first result generated from reading the first memory cell using the first magnitude,
identify a second magnitude of voltage greater than the first magnitude; and
retry reading the first memory cell for a second result, using the second magnitude of read voltage applied in two polarities;
wherein the controller is configured to decode the second result in parallel with a first read voltage of the second magnitude being applied to the first memory cell in a second one of the two polarities; and
wherein the second result is determined from the first memory cell being applied the first read voltage of the second magnitude in a first one of the two polarities, different from the second one of the two polarities.

14. The integrated circuit of claim 13, wherein the controller is configured to, use a bitline driver among the bitline drivers, and a wordline driver among the wordline drivers, to apply voltages to the first memory cell; and the two polarities include:

a first polarity in which the bitline driver drives a voltage higher than the wordline driver; and a second polarity in which the bitline driver drives a voltage lower than the wordline driver.

15. The integrated circuit of claim 13, wherein when the first memory cell is storing a first value, the first read voltage reduces a magnitude of a threshold voltage of the first memory cell in each of the two polarities; and when a second memory cell is storing a second value, different from the first value, a second read voltage reduces a magnitude of the threshold voltage of the first memory cell in each of the two polarities.

* * * * *